US012638760B2

(12) United States Patent (10) Patent No.: US 12,638,760 B2
Tsai (45) Date of Patent: May 26, 2026

(54) PROJECTION DEVICE AND HEAT DISSIPATION MODULE THEREOF

(71) Applicant: Coretronic Corporation, Hsin-Chu (TW)

(72) Inventor: Te-Ying Tsai, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 276 days.

(21) Appl. No.: 18/334,331

(22) Filed: Jun. 13, 2023

(65) Prior Publication Data

US 2024/0012317 A1 Jan. 11, 2024

(30) Foreign Application Priority Data

Jul. 6, 2022 (CN) .......................... 202221744793.4

(51) Int. Cl.
G03B 21/16 (2006.01)
H05K 7/20 (2006.01)

(52) U.S. Cl.
CPC ......... G03B 21/16 (2013.01); H05K 7/20145 (2013.01); H05K 7/20418 (2013.01)

(58) Field of Classification Search
CPC . G03B 21/16; H05K 7/20145; H05K 7/20418
USPC .......................................................... 353/52
See application file for complete search history.

(56) References Cited

U.S. PATENT DOCUMENTS

| 2007/0024815 A1* | 2/2007 | Oyama ................... G03B 21/16 |
| | | 353/54 |
| 2008/0151541 A1 | 6/2008 | Heffington et al. |
| 2012/0013854 A1 | 1/2012 | Nishimura et al. |
| 2014/0375970 A1* | 12/2014 | Nagahara ............. G03B 21/204 |
| | | 372/44.01 |

(Continued)

FOREIGN PATENT DOCUMENTS

| CN | 103807810 | 5/2014 | |
| CN | 104914543 A | * 9/2015 | ............... G02B 7/00 |
| CN | 104914543 | 8/2017 | |

(Continued)

OTHER PUBLICATIONS

Translation of CN_104914543_A (Year: 2025).*

(Continued)

*Primary Examiner* — Jerry L Brooks
(74) *Attorney, Agent, or Firm* — JCIPRNET

(57) ABSTRACT

A heat dissipation module and a projection device are provided. The heat dissipation module is used to dissipate heat from an integrating element of the projection device. The integrating element has a light incident surface, a light-emitting surface, and an optical axis. The heat dissipation module includes a rotating member, a first fixing frame, and a second fixing frame. The rotating member is adjacent to the light incident surface and includes a substrate and a driving device. The first fixing frame surrounds the integrating element along a circumferential direction of the integrating element. The first fixing frame has a peripheral surface and fins disposed at intervals. An extending direction (Continued)

of each fin is not parallel to the optical axis. The second fixing frame surrounds along a circumferential direction of the first fixing frame and has a space with the peripheral surface. The fins are disposed in the space.

21 Claims, 9 Drawing Sheets

(56)                    References Cited

U.S. PATENT DOCUMENTS

2021/0080096 A1      3/2021  Lucas

FOREIGN PATENT DOCUMENTS

| CN | 207020445 | | 2/2018 | | |
|----|-----------|---|--------|---|---|
| JP | 2000206455 | A * | 7/2000 | ............. | G03B 21/18 |
| JP | 2016213188 | A * | 12/2016 | ......... | G02B 27/0149 |
| WO | WO-2010116444 | A1 * | 10/2010 | ............. | G03B 21/16 |

OTHER PUBLICATIONS

Translation of JP_2016213188_A (Year: 2025).*
Translation of WO_2010116444_A1 (Year: 2025).*
Translation of JP 2000206455 (Year: 2025).*

* cited by examiner

PROJECTION DEVICE AND HEAT DISSIPATION MODULE THEREOF

CROSS-REFERENCE TO RELATED APPLICATION

This application claims the priority benefit of China application serial no. 202221744793.4, filed on Jul. 6, 2022. The entirety of the above-mentioned patent application is hereby incorporated by reference herein and made a part of this specification.

BACKGROUND

Technical Field

The disclosure relates to a projection device and a heat dissipation module thereof.

Description of Related Art

A hollow rod has several temperature specifications due to factors such as the use of rod coating, ceramic glue, and/or silicon glue. At present, the silicon glue has the lowest temperature resistance, and the specification temperature thereof is below 200° C., which is the reason why the cooling efficiency of the heat dissipation module needs to be increased.

Among the engineering-grade high-brightness projection device models, to increase the reliability of the integrating rod, a solid integrating rod design without silicon glue is used. This design uses a rod coating and only needs to consider the specification temperature of the rod coating (below about 400° C.). However, the solid integrating rod is more expensive, which leads to increased costs. At present, the heat dissipation of the hollow integrating rod only depends on the local disturbance caused by the rotation of the filter wheel in front of a light entrance of the integrating rod to cool the light incident area of the integrating rod. However, due to the related structures thereof (for example, rod coating, rod glue, holder glue, etc.), the temperature near the light-emitting area of the integrating rod is higher than the temperature of the light incident area, resulting in poor overall heat dissipation of the integrating rod.

In addition, in order to adjust the light yield and optical path, a holder is designed outside the integrating rod to hold the integrating rod, and the holder has an adjustable mechanism, but the holder of the integrating rod reduces the local disturbance near the integrating rod, causing the cooling efficiency of the integrating rod to be poorer.

With the continuous increase of the energy density of the excitation light source, the existing hollow integrating rod structure can no longer meet the heat dissipation requirements of the rod glue and the holder glue.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the disclosure was acknowledged by a person of ordinary skill in the art.

SUMMARY

The disclosure provides a heat dissipation module with good heat dissipation effect.

The disclosure provides a projection device with good projection effect.

A heat dissipation module of the disclosure is used to dissipate heat from an integrating element of a projection device. The integrating element has a light incident surface and a light-emitting surface and has an optical axis. The heat dissipation module includes a rotating member, a first fixing frame, and a second fixing frame. The rotating member includes a driving device and a substrate. The driving device drives the substrate to rotate, and the rotating member is adjacent to the light incident surface of the integrating element. The first fixing frame surrounds the integrating element along a circumferential direction of the integrating element and is used to fix the integrating element. The first fixing frame has a peripheral surface relatively far from the integrating element and a plurality of fins disposed at intervals. The fins surround the peripheral surface, and an extending direction of each fin is not parallel to the optical axis of the integrating element. The second fixing frame surrounds along a circumferential direction of the first fixing frame and has a space with the peripheral surface of the first fixing frame. The fins are disposed in the space.

The projection device of the disclosure includes an illumination system, a light valve, and a projection lens. The illumination system provides an illumination beam and includes an integrating element and a heat dissipation module. The heat dissipation module is used to dissipate heat from the integrating element. The illumination beam is emitted from the integrating element. The light valve is disposed on a path of the illumination beam. The illumination beam enters the light valve and is converted into an image beam by the light valve. The projection lens is disposed on a path of the image beam and is used to project the image beam out of the projection device.

Based on the above, the arrangement of the fins is improved and designed, so that the direction of the flow field and the direction of the optical axis are parallel to each other, so as to improve the heat dissipation effect of the heat dissipation module, thereby improving the projection effect of the projection device using the heat dissipation module.

Other objectives, features and advantages of the disclosure will be further understood from the further technological features disclosed by the embodiments of the disclosure wherein there are shown and described preferred embodiments of this disclosure, simply by way of illustration of modes best suited to carry out the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

3

Figure 6B:
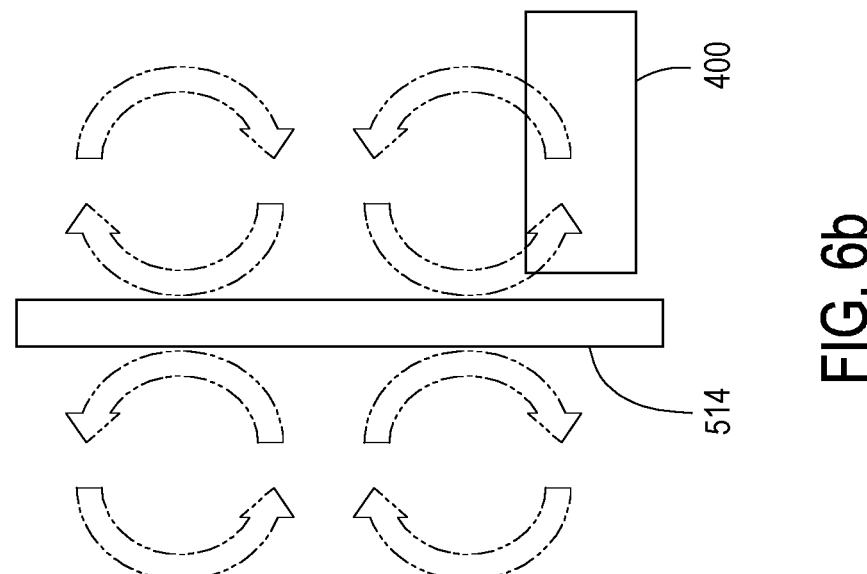
FIG. 6a is a schematic view of a partial flow field of the heat dissipation module.
Figure 6A:
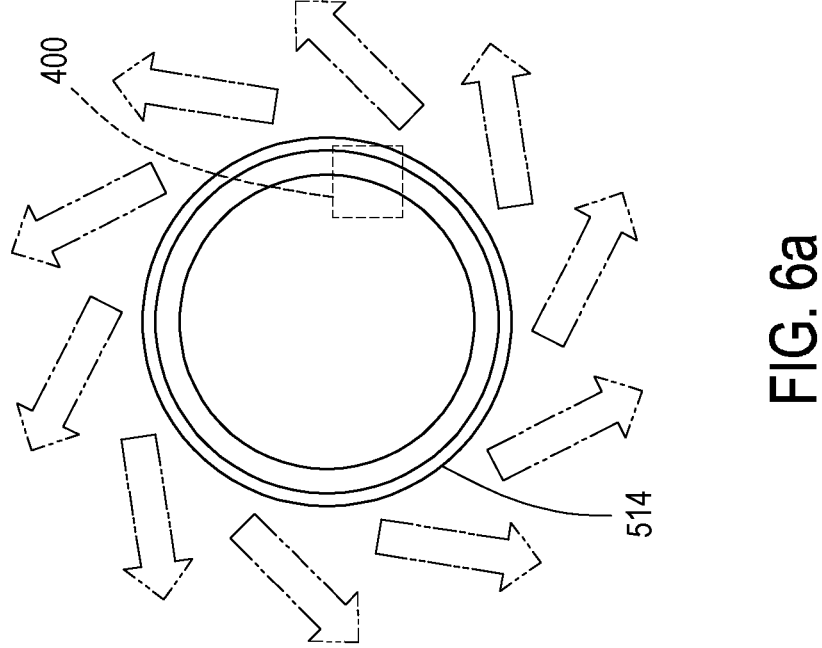

FIG. 6*b* is a side view of the partial flow field of FIG. 6*a*.

Figure 7:
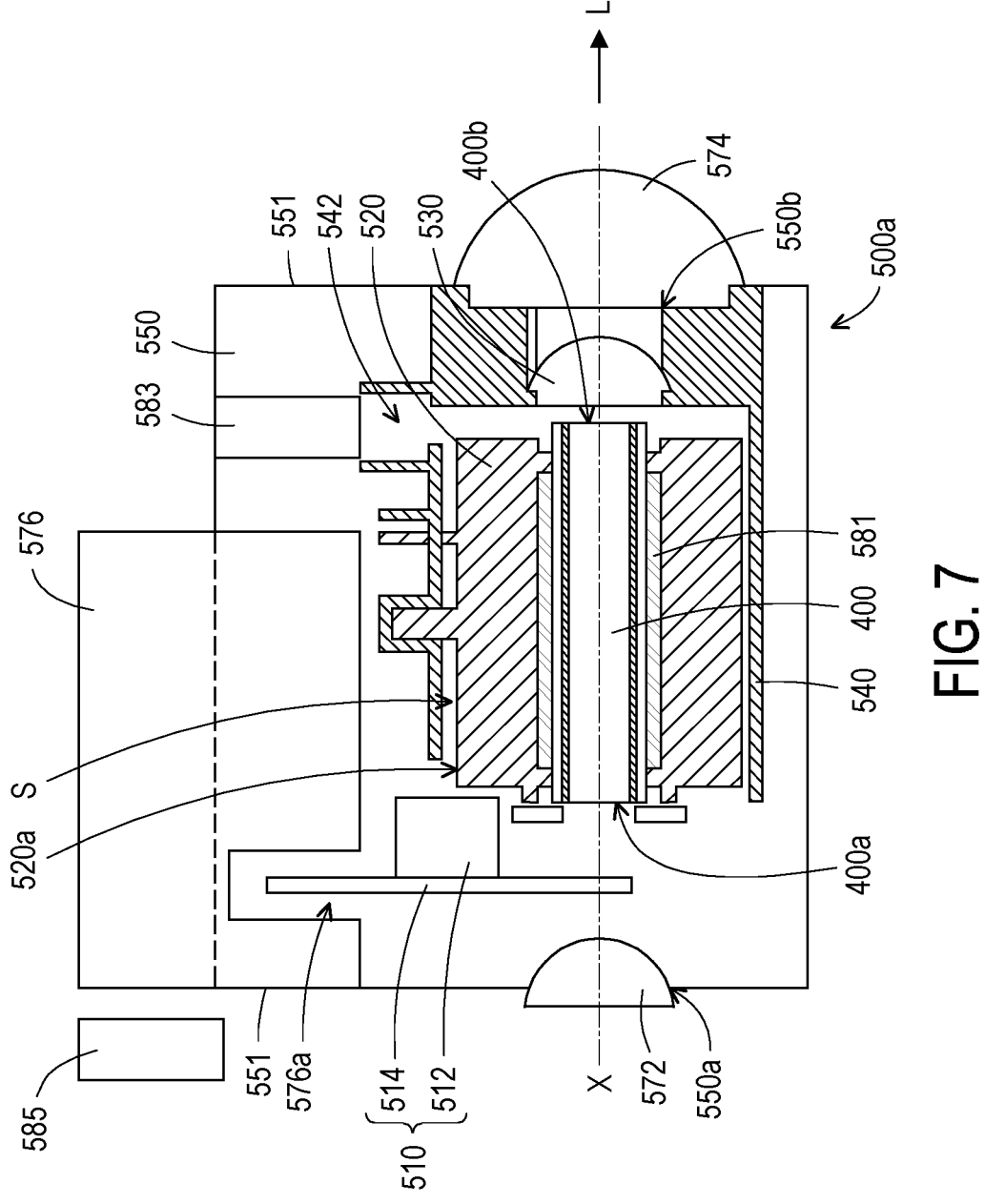

FIG. 7 is a schematic view of a heat dissipation module according to a second embodiment of the disclosure.

Figure 8:
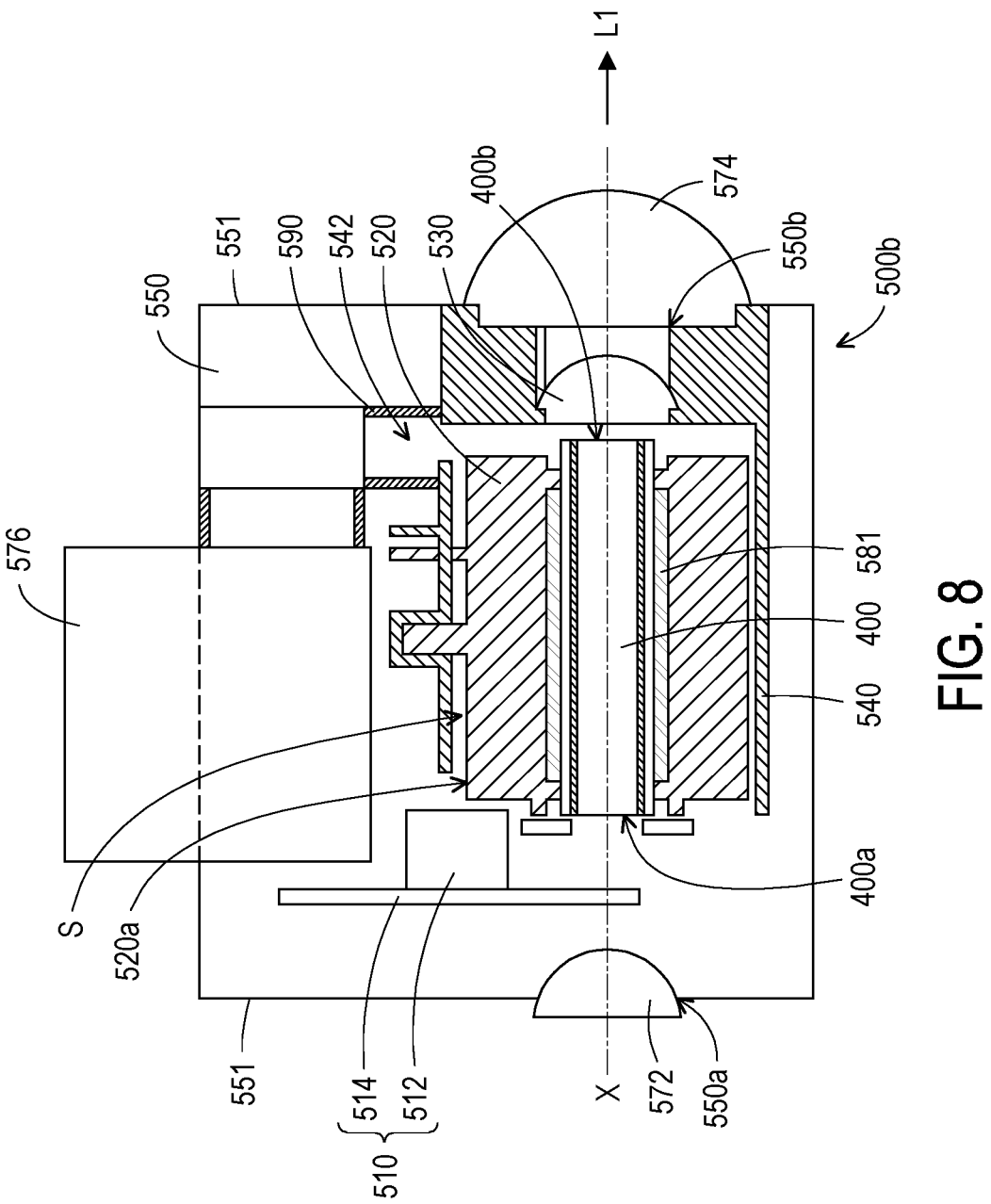

FIG. 8 is a schematic view of a heat dissipation module according to a third embodiment of the disclosure.

DETAILED DESCRIPTION OF DISCLOSED EMBODIMENTS

In the following detailed description of the preferred embodiments, reference is made to the accompanying drawings which form a part hereof, and in which are shown by way of illustration specific embodiments in which the disclosure may be practiced. In this regard, directional terminology, such as "top," "bottom," "front," "back," etc., is used with reference to the orientation of the Figure(s) being described. The components of the present disclosure can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings.

Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

First Embodiment

Figure 1:
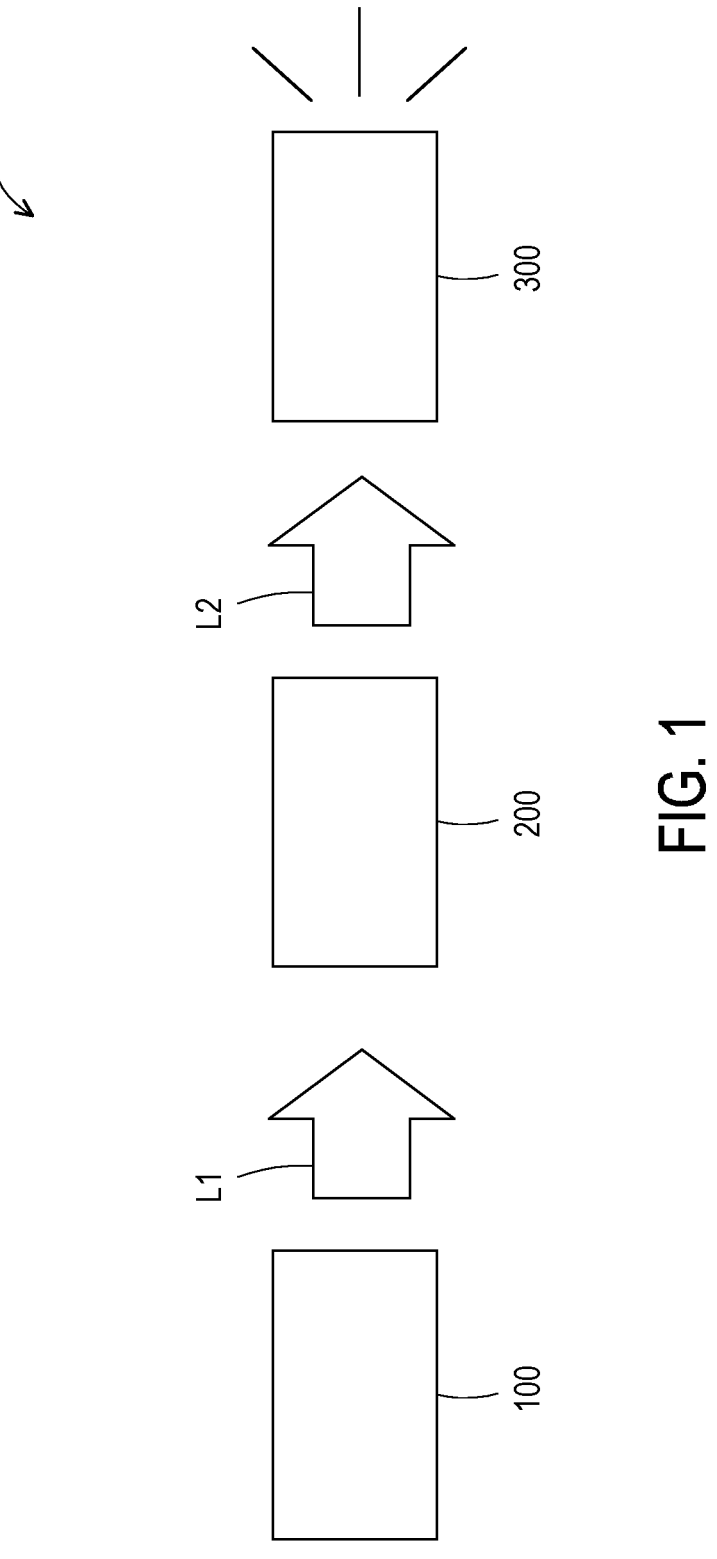
FIG. 1 is a schematic view of a projection device according to a first embodiment of the disclosure.
Figure 2:
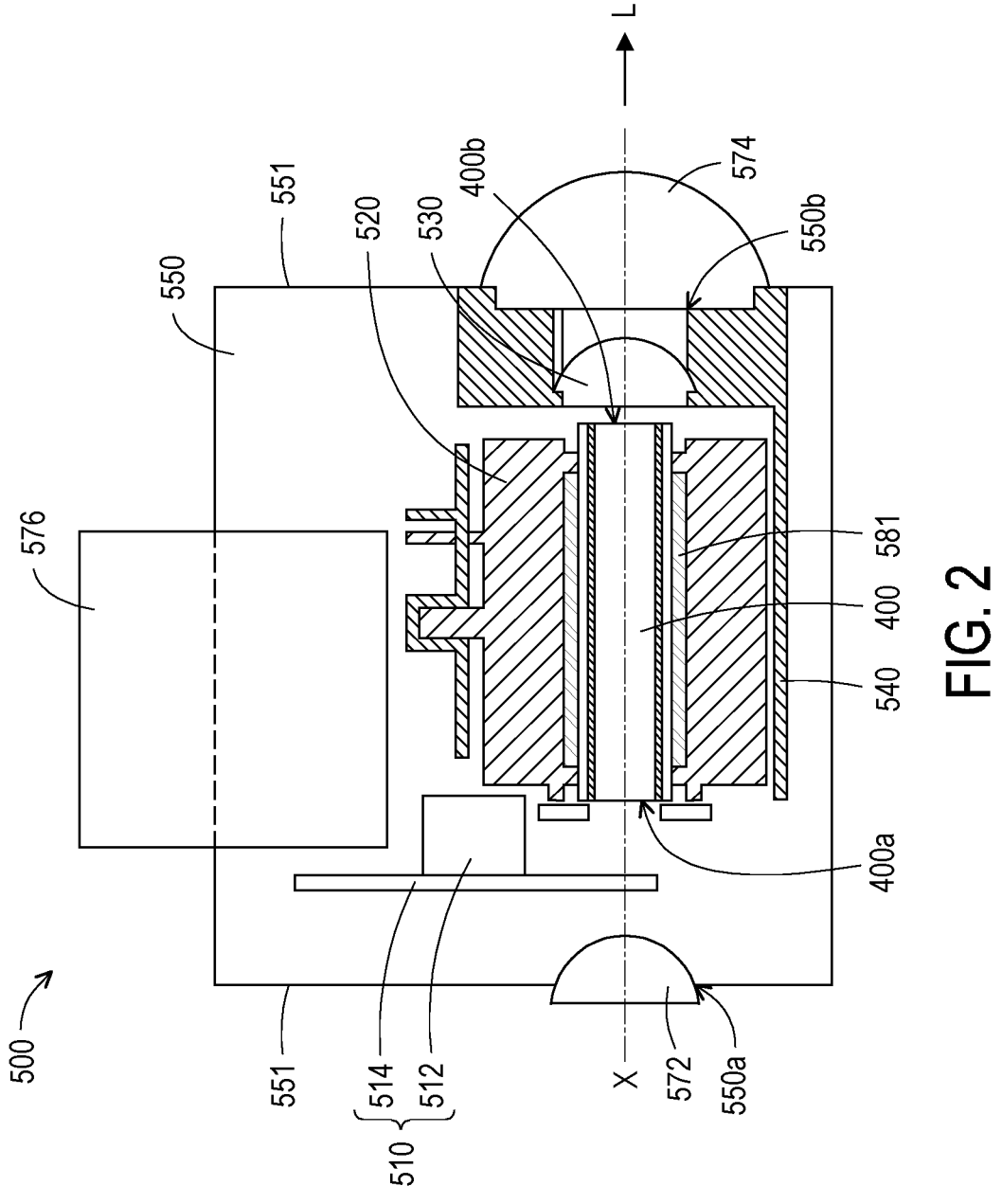
FIG. 2 is a schematic view of an integrating element and a heat dissipation module in the projection device.

FIG. 1 is a schematic view of a projection device according to a first embodiment of the disclosure, and FIG. 2 is a schematic view of an integrating element and a heat dissipation module in the projection device.

Please refer to FIG. 1 and FIG. 2 at the same time. A projection device 1 includes an illumination system 100, a light valve 200, and a projection lens 300. The illumination system 100 is used to provide an illumination beam L1, wherein the illumination system 100 includes an integrating element 400 and a heat dissipation module 500 for dissipating heat from the integrating element 400, and the illumination beam L1 is emitted from the integrating element 400. The light valve 200 is disposed on a path of the illumination beam L1, wherein the illumination beam L1 is incident on the light valve 200 and is converted into an image beam L2 by the light valve 200. The projection lens 300 is disposed on a path of the image beam L2 and is used to project the image beam L2 out of the projection device 1.

Please refer to FIG. 1 and FIG. 2 at the same time. The integrating element 400 has a light incident surface 400*a*, a light-emitting surface 400*b*, and an optical axis X passing through the light incident surface 400*a* and the light-emitting surface 400*b*. In this embodiment, the integrating element 400 is an integrating rod with a transparent solid structure or an integrating rod with a hollow cavity, which may be selected according to requirements.

The heat dissipation module 500 includes a rotating member 510, a first fixing frame 520, a lens 530, a second fixing frame 540, and a housing 550.

The housing 550 has a light entrance 550*a* and a light exit 550*b*, wherein the light entrance 550*a* and the light exit 550*b* are respectively disposed on two opposite side walls 551 of the housing 550, and the light entrance 550*a* and the light exit 550*b* are disposed on the optical axis X of the integrating element 400 and respectively correspond to the light incident surface 400*a* and the light-emitting surface 400*b* of the integrating element 400. That is, the light entrance 550*a* of the housing 550 corresponds to the light incident surface 400*a* of the integrating element 400, and the light exit 550*b* of the housing 550 corresponds to the light-emitting surface 400*b* of the integrating element 400. The rotating member 510, the integrating element 400, the first fixing frame 520, at least one lens 530, and the second fixing frame 540 are disposed in the housing 550.

The rotating member 510 is disposed adjacent to the light incident surface 400*a* of the integrating element 400, wherein the rotating member 510 includes a driving device 512 and a substrate 514, and the driving device 512 is used to drive the substrate 514 to rotate.

Figure 3:
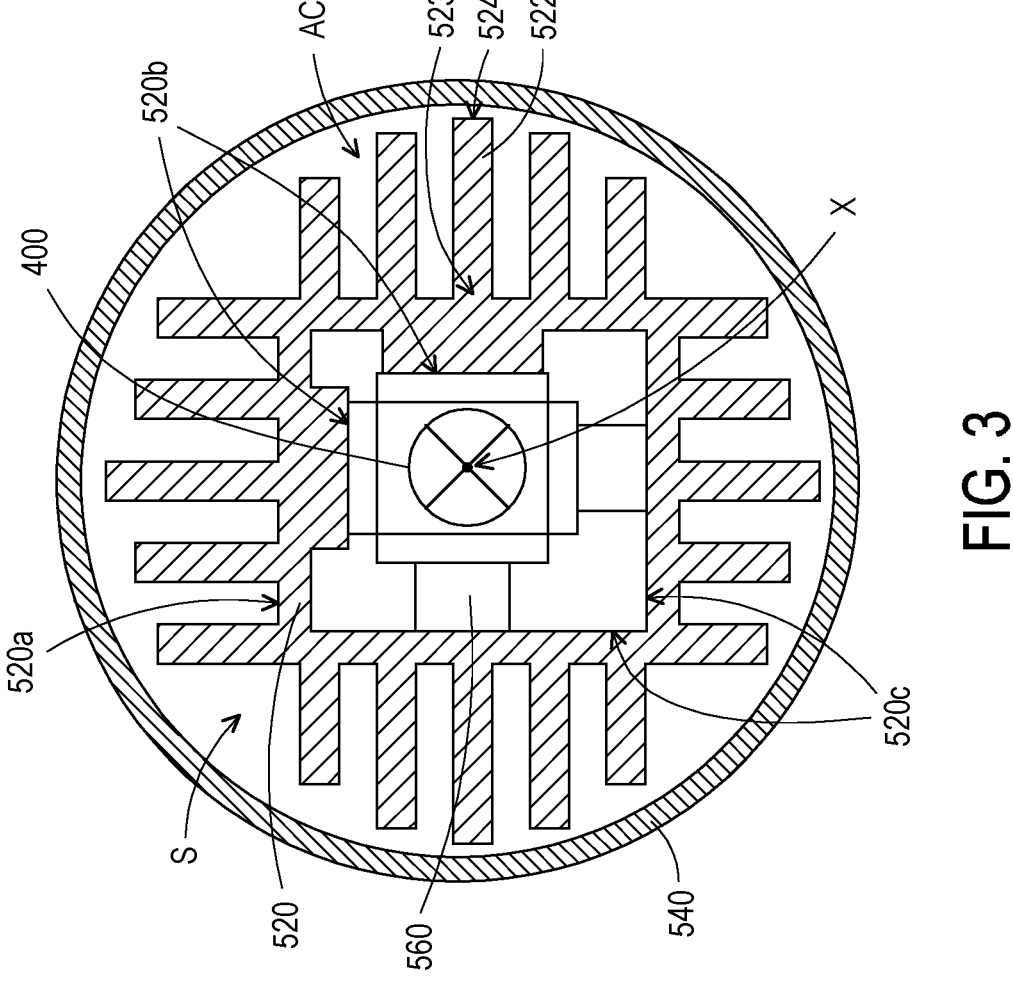
FIG. 3 is a schematic cross-sectional view of the integrating element installed on a first fixing frame.

FIG. 3 is a schematic cross-sectional view of the integrating element installed on the first fixing frame.

Please refer to FIG. 2 and FIG. 3 at the same time. The first fixing frame 520 surrounds the integrating element 400 along a circumferential direction of the integrating element 400 to fix the integrating element 400. The first fixing frame 520 has an peripheral surface 520*a* relatively far from the integrating element 400 and a plurality of fins 522 disposed at intervals, wherein the fins 522 surround the peripheral surface 520*a*, and an extending direction of each fin 522 is not parallel to the optical axis X of the integrating element 400.

Specifically, a side 523 of each fin 522 is connected to the peripheral surface 520*a* of the first fixing frame 520, and the other side 524 extends away from the peripheral surface 520*a* and the extending direction is not parallel to the optical axis X.

In this embodiment, the peripheral surface 520*a* of the first fixing frame 520 surrounds to form a rectangle. That is, the cross-section of the first fixing frame 520 is, for example, a rectangle. However, in other embodiments, the cross-section of the first fixing frame 520 may be, for example, a square or circle. The fins 522 are radially arranged on the peripheral surface 520*a* of the first fixing frame 520 with the optical axis X of the integrating element 400 as the center. Extending directions of the fins 522 on adjacent sides of the rectangle are perpendicular to each other. An airflow channel AC extending along the direction of the optical axis X is formed between the two adjacent fins 522, and an extending direction of the airflow channel AC is parallel to the optical axis X.

In this embodiment, the fins 522 may be columnar fins or sheet-like fins and are arranged according to requirements to form the airflow channel AC.

The lens 530 is disposed on one side of the light-emitting surface 400*b* of the integrating element 400 and is disposed on the optical axis X of the integrating element 400.

The second fixing frame 540 surrounds the first fixing frame 520 along the circumferential direction of the first fixing frame 520, and there is a space S between the second fixing frame 540 and the peripheral surface 520*a* of the first fixing frame 520. The fins 522 are disposed in the space S, and the lens 530 disposed on one side of the light-emitting surface 400*b* of the integrating element 400 is fixed to the second fixing frame 540. In this embodiment, the circumferential direction is the direction around the entire circumference of the first fixing frame 520, regardless of the cross-sectional shape of the assembly.

The first fixing frame 520 in this embodiment is an adjustable moving member, and the first fixing frame 520 may be rotated relative to the second fixing frame 540 through an adjustment structure (not shown).

The heat dissipation module 500 further includes two spring plates 560. The first fixing frame 520 has two internal bearing surfaces 520*b* and two internal abutting surfaces 520*c* facing the integrating element 400. The two internal bearing surfaces 520*b* are disposed adjacent to each other, the two internal abutting surfaces 520*c* are disposed adjacent to each other, and the two internal bearing surfaces 520*b* and the two internal abutting surfaces 520*c* surround the integrating element 400 together. The two spring plates 560 are respectively disposed between the two abutting inner surfaces 520*c* and the integrating element 400, and the spring plate 560 is used to push against the integrating element 400, so that the integrating element 400 bears against the two internal bearing surfaces 520*b* to avoid unnecessary movement.

The heat dissipation module 500 further includes two lenses 572 and 574 disposed on the optical axis X of the integrating element 400, which are respectively disposed at the light entrance 550*a* and the light exit 550*b* of the housing 550, so that the housing 550 forms an enclosed housing, wherein the lens 574 corresponding to the light exit 550*b* is fixed by the second fixing frame 540, and the lens 530 is disposed between the lens 574 and the integrating element 400.

As mentioned above, heat is easily accumulated in the housing 550 which is enclosed, so the heat dissipation module 500 further includes a first heat sink 576 disposed on one side of the first fixing frame 520, wherein a part of the first heat sink 576 is disposed inside the housing 550, and another part of the first heat sink 576 is disposed outside the housing 550. The configuration of the first heat sink 576 can effectively guide the heat accumulated in the housing 550 to the outside of the housing 550 to be dissipated. In addition, when the rotating member 510 rotates, the hot airflow at the light incident surface 400*a* of the integrating element 400 can be brought toward the first heat sink 576, and the heat is guided to the outside of the housing 550 by the first heat sink 576, is cooled through the airflow of the first heat sink 576, and is then guided to the airflow channel AC between the fins, so as to dissipate the heat from the integrating element 400. In this embodiment, the first heat sink 576 includes, for example, a plurality of fins (not shown), and an airflow channel (not shown) parallel to the optical axis X is also formed between the fins, so as to facilitate airflow.

Figure 4:
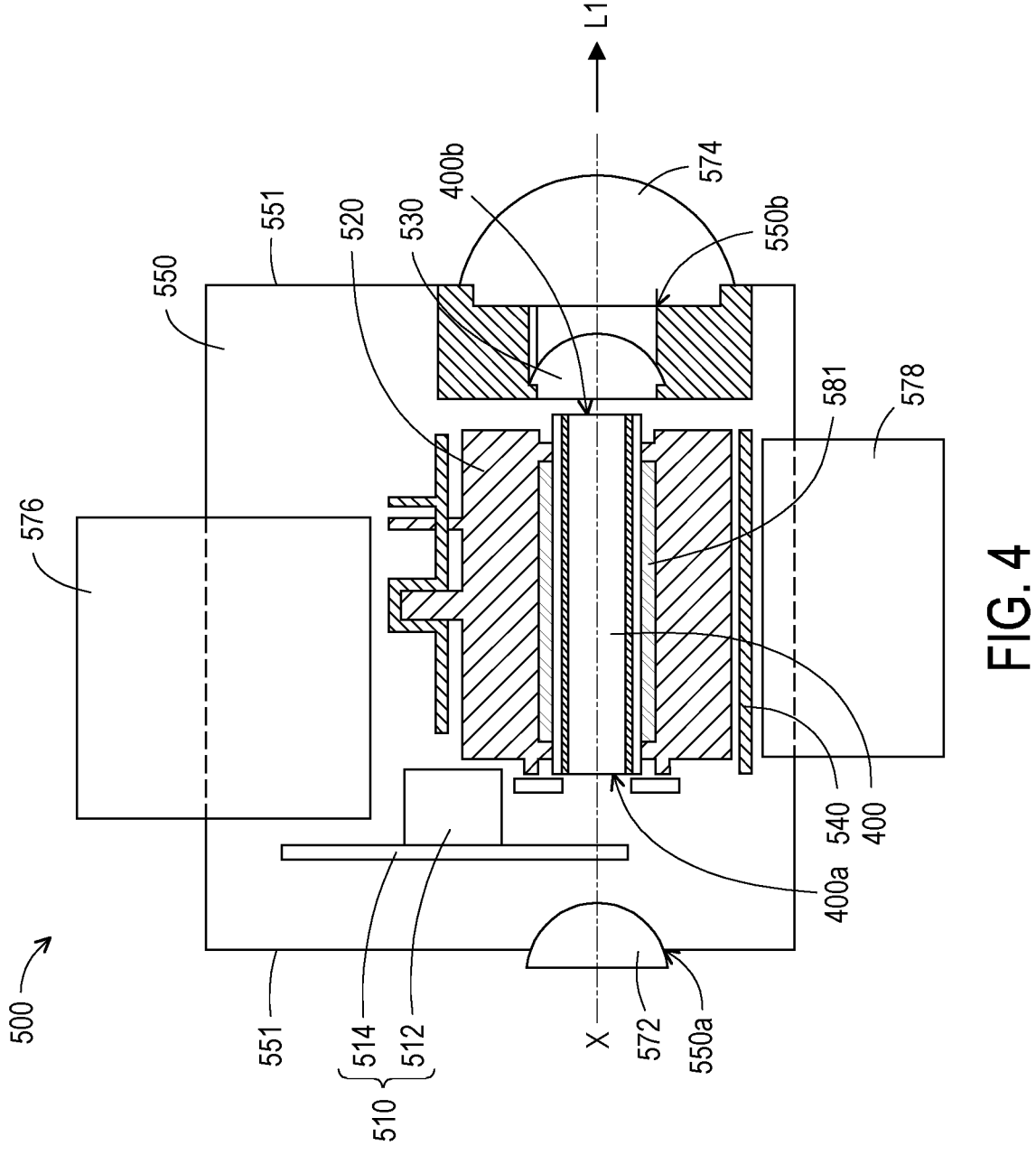
FIG. 4 is a schematic view of the heat dissipation module further including a second heat sink.

FIG. 4 is a schematic view of the heat dissipation module further including a second heat sink. Please refer to FIG. 4.

The heat dissipation module 500 may further include a second heat sink 578. The second heat sink 578 and the first heat sink 576 are disposed on two opposite sides of the first fixing frame 520. That is, the second heat sink 578 and the first heat sink 576 are respectively disposed on two opposite sides of the integrating element 400. A part of the second heat sink 578 is disposed inside the housing 550, and another part of the second heat sink 578 is disposed outside the housing 550. The configuration of the second heat sink 578 can further improve the heat dissipation effect of the heat dissipation module 500.

Incidentally, in the above embodiment, as shown in FIG. 3, the fins 522 are radially arranged on the peripheral surface 520*a* of the first fixing frame 520 with the optical axis X of the integrating element 400 as the center, such that the extending directions of the fins 522 on the two adjacent sides of the first fixing frame 520 are perpendicular to each other, and the extending directions of the fins 522 on the two opposite sides are parallel to each other. In addition, the extending directions of the fins 522 disposed on the same side are parallel to each other. However, the arrangement of the fins 522 is not limited thereto.

Figure 5A:
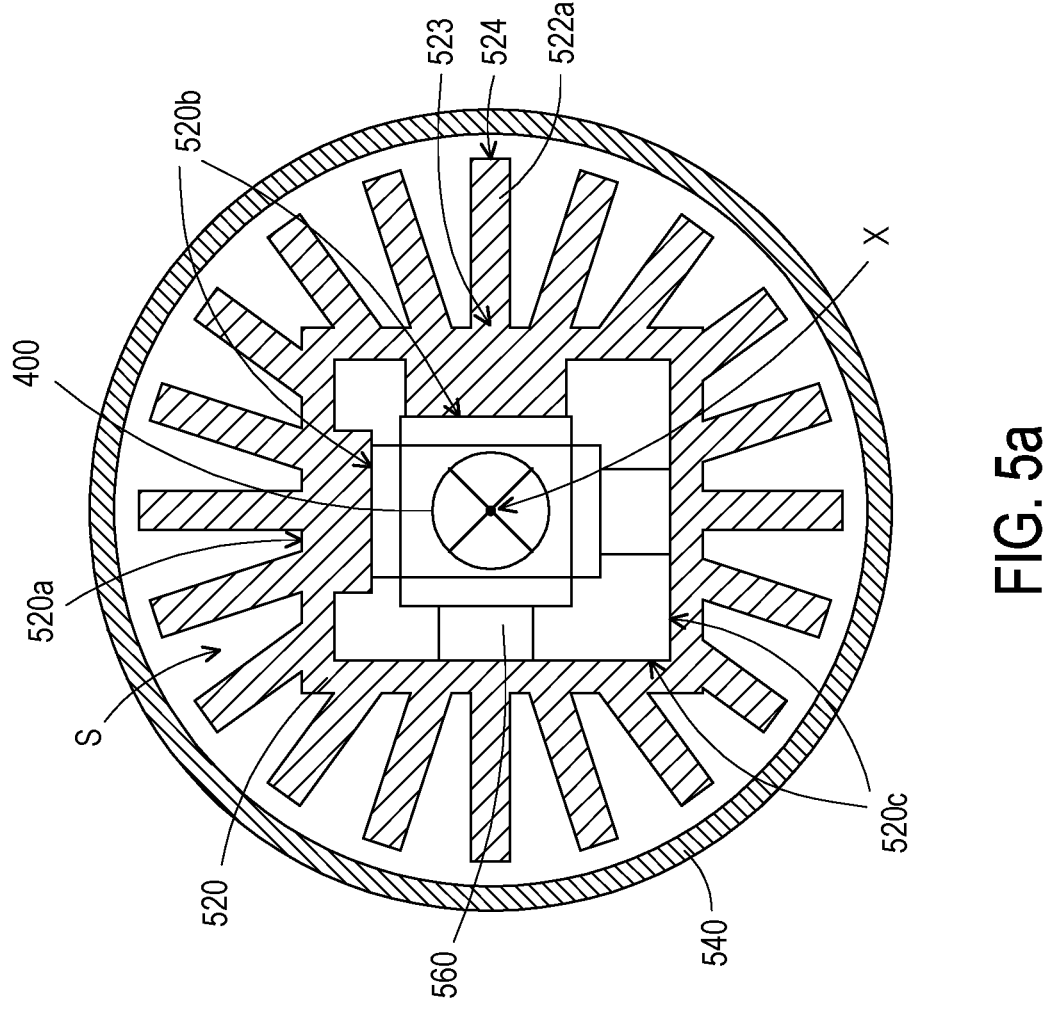
FIG. 5a and FIG. 5b are schematic views of other arrangements of fins.
Figure 5B:
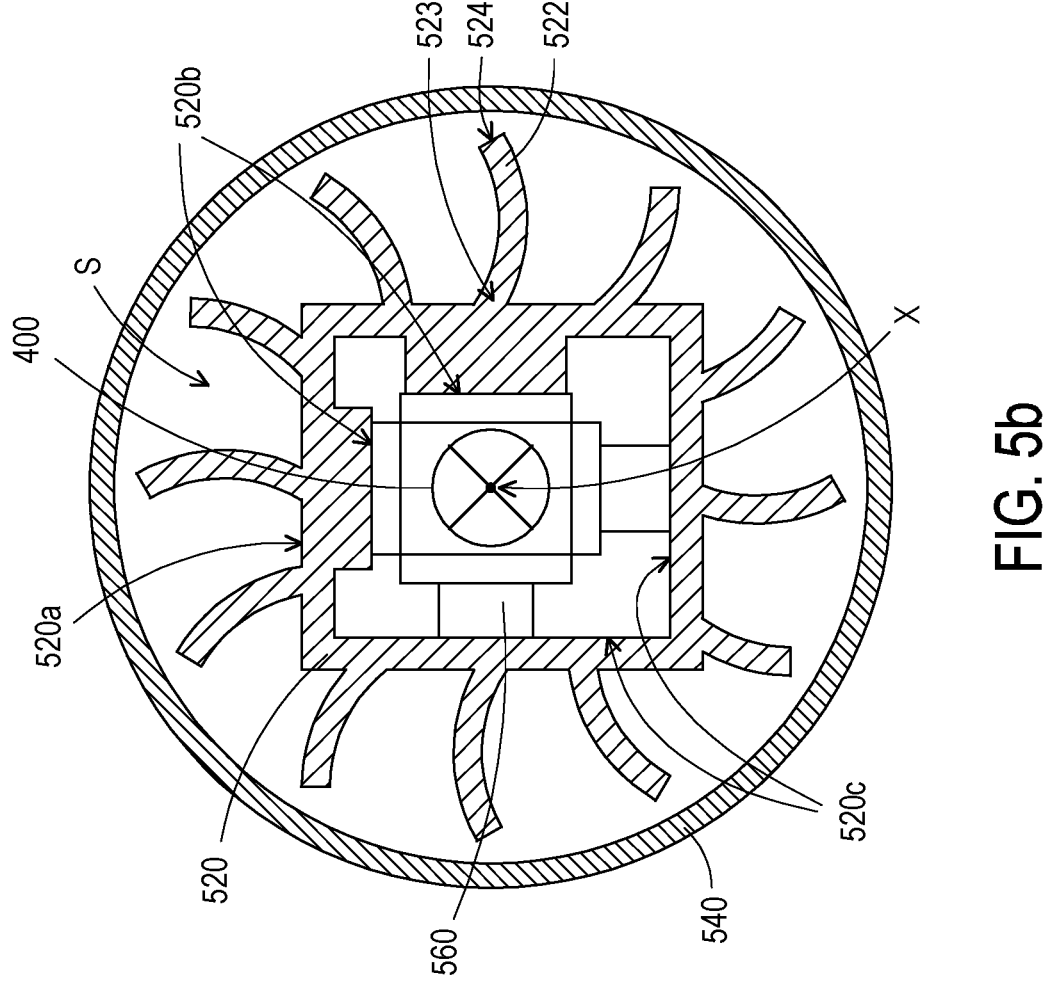

FIG. 5*a* and FIG. 5*b* are schematic views of other arrangements of the fins.

As shown in FIG. 5*a*, similarly, fins 522*a* are radially arranged on the peripheral surface 520*a* of the first fixing frame 520 with the optical axis X of the integrating element 400 as the center, but extending directions of the two fins 522*a* on the same extension line perpendicular to the optical axis X are parallel to each other. In addition, the extending directions of any two adjacent fins 522*a* form an angle, and any two adjacent fins 522*a* are neither perpendicular nor parallel to each other.

As shown in FIG. 5*b*, similarly, the fins 522*b* are radially arranged on the peripheral surface 520*a* of the first fixing frame 520 with the optical axis X of the integrating element 400 as the center, but each fin 522*b* is in the shape of a spiral sheet, that is, one side of each fin 522*b* is connected to the peripheral surface 520*a* of the first fixing frame 520, the other side extends away from the peripheral surface 520*a*, and the two sides of each fin 522*b* are curved. The fins 522*c* in the shape of the spiral sheet increase the contact area of airflow, thereby effectively improving the heat dissipation effect.

In addition, the heat dissipation module 500 may further include a thermally conductive material 581 disposed between the integrating element 400 and the first fixing frame 520. The thermally conductive material 581 may fill the space S between the integrating element 400 and the first fixing frame 520, so that the heat of the integrating element 400 is conducted to the first fixing frame 520 through the thermally conducting material 581 and is then dissipated outside the housing 550.

FIG. 6*a* is a schematic view of a partial flow field of the heat dissipation module, and FIG. 6*b* is a side view of the partial flow field of FIG. 6*a*. Please refer to FIG. 3, FIG. 6*a*, and FIG. 6*b*. The substrate 514 of the rotating member 510 of the heat dissipation module 500 is driven to rotate to generate airflow, and the airflow brings the heat from the light incident surface 400*a* of the integrating element 400 toward the first heat sink 576, is cooled through the airflow of the first heat sink 576, and is then guided to the airflow channel AC between the fins. The configuration of the fins 522 in the heat dissipation module 500 and the airflow channel AC therebetween makes the direction of the flow field parallel to the direction of the optical axis X, so that the heat dissipation efficiency of the heat dissipation module 500 can be effectively improved, thereby improving the projection effect of the projection device 1 using the heat dissipation module 500.

In addition, in order to further improve the heat dissipation effect of the heat dissipation module 500, a fan may be disposed outside the housing 550 corresponding to the first heat sink 576 and/or the second heat sink 578 to provide forced convection airflow to the part of the first heat sink 576 and/or the second heat sink 578 outside the housing 550.

Second Embodiment

FIG. 7 is a schematic view of a heat dissipation module according to a second embodiment of the disclosure. Please refer to FIG. 7. This embodiment is substantially the same as the first embodiment, and the differences are described as follows.

First, a heat dissipation module 500a further includes a first fan 583 disposed on one side of the first fixing frame 520, and airflow generated by the first fan 583 is guided into the second fixing frame 540.

Specifically, the second fixing frame 540 has an opening 542 adjacent to one side of the light-emitting surface 400b of the integrating element 400, and the airflow generated by the first fan 583 passes through the opening 542 and is guided to the space S between the second fixing frame 540 and the peripheral surface 520a of the first fixing frame 520, so as to dissipate heat from the integrating element 400.

The heat dissipation module 500 may further include a second fan 585. The second fan 585 is disposed outside the housing 550 corresponding to the part of the first heat sink 576 outside the housing 550, and airflow generated by the second fan 585 passes through the part of the second heat sink 578 disposed outside the housing 550.

In addition, in order to reduce the overall volume of the heat dissipation module 500a, the part of the first heat sink 576 inside the housing 550 may have a groove 576a, and a part of the substrate 514 is accommodated in the groove 576a.

Third Embodiment

FIG. 8 is a schematic view of a heat dissipation module according to a third embodiment of the disclosure. Please refer to FIG. 8. This embodiment is substantially the same as the first embodiment, and the differences are described as follows.

A heat dissipation module 500b further includes a first fan 583 and an air duct 590 disposed on one side of the first fixing frame 520. The second fixing frame 540 has an opening 542 adjacent to one side of the light-emitting surface 400b of the integrating element 400. The air duct 590 is disposed between the first fan 583 and the opening 542, and is used to guide airflow generated by the first fan 583 to the opening 542. In addition, the air duct may also be disposed between the first heat sink 576 and the first fan 583 to accelerate the airflow of the first heat sink 576, wherein the air duct 590 may be integrally formed with the second fixing frame 540 or be an independent element and disposed in the opening 542, which may be designed according to actual requirements.

To sum up, in the heat dissipation module of the disclosure, the direction of the flow field is parallel to the direction of the optical axis through the configuration of the fins, so the heat dissipation efficiency of the heat dissipation module can be effectively improved, thereby improving the projection effect of the projection device using the heat dissipation module and prolonging the service life of the projection device.

The foregoing description of the preferred embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby enabling persons skilled in the art to understand the disclosure for various embodiments and with various modifications as are suited to the particular use or implementation contemplated. It is intended that the scope of the disclosure be defined by the claims appended hereto and their equivalents in which all terms are meant in their broadest reasonable sense unless otherwise indicated. Therefore, the term "the disclosure", "the present disclosure" or the like does not necessarily limit the claim scope to a specific embodiment, and the reference to particularly preferred exemplary embodiments of the disclosure does not imply a limitation on the disclosure, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the disclosure. It should be appreciated that variations may be made in the embodiments described by persons skilled in the art without departing from the scope of the present disclosure as defined by the following claims. Moreover, no element and component in the present disclosure is intended to be dedicated to the public regardless of whether the element or component is explicitly recited in the following claims.

What is claimed is:

1. A heat dissipation module for dissipating heat from an integrating element of a projection device, wherein the integrating element has a light incident surface and a light-emitting surface and has an optical axis, comprising: a rotating member, a first fixing frame, a second fixing frame, a housing and at least one lens, wherein the rotating member comprises a driving device and a substrate, wherein the driving device drives the substrate to rotate, and the rotating member is adjacent to the light incident surface of the integrating element;

the first fixing frame surrounds the integrating element along a circumferential direction of the integrating element and is used to fix the integrating element, wherein the first fixing frame has a peripheral surface relatively far from the integrating element and a plurality of fins disposed at intervals, the plurality of fins surround the peripheral surface, and an extending direction of each of the plurality of fins is not parallel to the optical axis of the integrating element;

the second fixing frame surrounds along a circumferential direction of the first fixing frame and has a space with the peripheral surface of the first fixing frame, the plurality of fins are disposed in the space, and a plurality of airflow channels are extending along a direction of the optical axis between the plurality of fins, and each of the plurality of airflow channels is formed between two adjacent fins of the plurality of fins, wherein the housing comprises a light entrance and a light exit, and the at least one lens is disposed at the light entrance of the housing or between the light-emitting surface of the integrating element and the light exit of the housing, wherein the plurality of airflow channels are in gaseous communication with a region between the at least one lens and the integrating element.

2. The heat dissipation module according to claim 1, wherein the plurality of fins are radially arranged with the optical axis of the integrating element as a center.

3. The heat dissipation module according to claim 2, wherein each of the plurality of fins is in a shape of a column or a sheet.

4. The heat dissipation module according to claim 2, wherein the peripheral surface of the first fixing frame surrounds to form a rectangle, and extending directions of a part of the plurality of fins disposed on adjacent sides of the rectangle are perpendicular to each other.

5. The heat dissipation module according to claim 2, wherein extending directions of two of the plurality of fins disposed on a same extension line perpendicular to the optical axis are parallel to each other.

6. The heat dissipation module according to claim 2, wherein each of the plurality of fins is in a shape of a spiral sheet.

7. The heat dissipation module according to claim 1, further comprising two spring plates, wherein the first fixing frame has two internal bearing surfaces and two internal abutting surfaces facing the integrating element, the two internal bearing surfaces are adjacently disposed, the two internal abutting surfaces are adjacently disposed, and the two spring plates are respectively disposed between the two internal abutting surfaces and the integrating element and push against the integrating element to bear the integrating element against the two internal bearing surfaces.

8. The heat dissipation module according to claim 1, wherein the integrating element is a transparent solid structure or has a hollow cavity.

9. The heat dissipation module according to claim 1, the light entrance and the light exit are respectively disposed on two opposite side walls of the housing, wherein the rotating member, the integrating element, the first fixing frame, and the second fixing frame are disposed in the housing, and the light entrance and the light exit are disposed on the optical axis of the integrating element and respectively correspond to the light incident surface and the light-emitting surface of the integrating element.

10. The heat dissipation module according to claim 9, wherein a number of the at least one lens is two, and the two lenses are respectively disposed at the light entrance and the light exit of the housing, so that the housing forms an enclosed housing.

11. The heat dissipation module according to claim 9, further comprising a first heat sink, disposed on one side of the first fixing frame.

12. The heat dissipation module according to claim 11, wherein the first heat sink has a groove, and a part of the substrate is accommodated in the groove.

13. The heat dissipation module according to claim 11, wherein a part of the first heat sink is disposed inside the housing, and another part of the first heat sink is disposed outside the housing.

14. The heat dissipation module according to claim 13, further comprising a second heat sink, disposed on two opposite sides of the first fixing frame with the first heat sink.

15. The heat dissipation module according to claim 14, wherein a part of the second heat sink is disposed inside the housing, and another part of the second heat sink is disposed outside the housing.

16. The heat dissipation module according to claim 1, further comprising a first fan, disposed on one side of the first fixing frame.

17. The heat dissipation module according to claim 16, wherein the second fixing frame has an opening adjacent to the light-emitting surface of the integrating element, and airflow generated by the first fan passes through the opening and is guided to the space between the second fixing frame and the peripheral surface of the first fixing frame.

18. The heat dissipation module according to claim 17, further comprising an air duct, wherein the air duct is disposed between the first fan and the opening, and is used to guide the airflow generated by the first fan to the opening, wherein the air duct is integrally formed with the second fixing frame or is an independent element and is disposed in the opening.

19. The heat dissipation module according to claim 1, further comprising a thermally conductive material, disposed between the integrating element and the first fixing frame.

20. A projection device, comprising: an illumination system, a light valve, and a projection lens, wherein the illumination system provides an illumination beam and comprises an integrating element and the heat dissipation module according to claim 1 and the heat dissipation module is used to dissipate heat from the integrating element, wherein the illumination beam is emitted from the integrating element;

the light valve is disposed on a path of the illumination beam, wherein the illumination beam is incident on the light valve and is converted into an image beam by the light valve; and the projection lens is disposed on a path of the image beam and is used to project the image beam out of the projection device.

21. The heat dissipation module according to claim 1, wherein a number of the at least one lens is three, two of the three lenses are respectively disposed at the light entrance and the light exit of the housing, and the rest one of the three lenses is disposed between light-emitting surface of the integrating element and the light exit of the housing, and is fixed to the second fixing frame.

* * * * *